United States Patent [19]
Yamaguchi

[11] Patent Number: 6,072,336
[45] Date of Patent: *Jun. 6, 2000

[54] SAMPLING CIRCUIT SYSTEM

[75] Inventor: Junichiro Yamaguchi, Tokyo, Japan

[73] Assignee: Ando Electric Co., Ltd., Tokyo, Japan

[ * ] Notice: This patent is subject to a terminal disclaimer.

[21] Appl. No.: 09/105,242

[22] Filed: Jun. 26, 1998

[30] Foreign Application Priority Data

Jun. 30, 1997 [JP] Japan .................................. 9-189056

[51] Int. Cl.$^7$ .......................... G01R 25/00; H03D 13/00
[52] U.S. Cl. .................................. 327/12; 327/9; 327/43; 327/91; 327/218
[58] Field of Search ................. 327/91, 94, 218

[56] References Cited

U.S. PATENT DOCUMENTS 5,923,190  7/1999  Yamaguchi ................................ 327/12

Primary Examiner—Toan Tran
Assistant Examiner—Quan Tra
Attorney, Agent, or Firm—Flynn, Thiel, Boutell & Tanis, P.C.

[57] ABSTRACT

A sampling circuit system enhances sampling resolution without increasing frequencies of clock signals for sampling. An input waveform is input to a first group of sampling circuits and a sampling circuit serving as a standard circuit. Clock signals out of phase from each other by 2 π/n (n=an integer not less than 3) radian, respectively, against a clock signal input to the standard circuit are input to the first group of sampling circuits for sampling. Then sampling signals output from the first group of the sampling circuits are input to a second group of sampling circuits so as to be sampled again by inputting a sampling signal output from the standard circuit as a common clock signal for the second group of sampling circuits.

1 Claim, 1 Drawing Sheet

6,072,336

SAMPLING CIRCUIT SYSTEM

BACKGROUND OF THE INVENTION

1. Field of the Invention

The invention relates to a sampling circuit system wherein sampling resolution can be enhanced without increasing the frequencies of clock signals for sampling an input waveform.

2. Description of the Related Art

FIG. 2 shows a block diagram of a conventional sampling circuit for sampling an input waveform with a clock signal. In FIG. 2, a case is shown wherein a D type flip-flop (referred to hereinafter as DFF) is used for a sampling circuit.

In FIG. 2, an input waveform 1, a signal to be sampled, is inputted to an input terminal D of a DFF 4, and the input waveform 1 is sampled by inputting a clock signal 2 at a predetermined frequency to a clock terminal CK thereof, and a sampling waveform 3 is outputted from an output terminal Q of the DFF 4.

In the conventional sampling circuit described above, however, there is a problem that a frequency of the clock signal 2 needs to be increased in order to enhance sampling resolution.

SUMMARY OF THE INVENTION

Accordingly, it is an object of the present invention to provide a sampling circuit system capable of enhancing sampling resolution without increasing frequencies of clock signals.

To this end, the sampling circuit system according to the invention comprises a first group consisting of any number (n) of sampling circuits 14a~14n wherein sampling of an input waveform 11 is performed with clock signals 12a~12n, out of phase by 2 π/n (n=an integer not less than 3) radian from each other, respectively, designating predetermined one of the sampling circuits, 14a, as a standard sampling circuit, and a second group consisting of sampling circuits 16b~16n, equivalent in number to the sampling circuits 14b~14n of the first group excluding the standard sampling circuit 14a, wherein sampling signals outputted from the sampling circuits 14b~14n of the first group excluding the standard sampling circuit 14a, as respective input waveforms, are sampled with a sampling signal outputted from the standard sampling circuit 14a as a clock signal.

DESCRIPTION OF THE PREFERRED EMBODIMENTS

Figure 1:
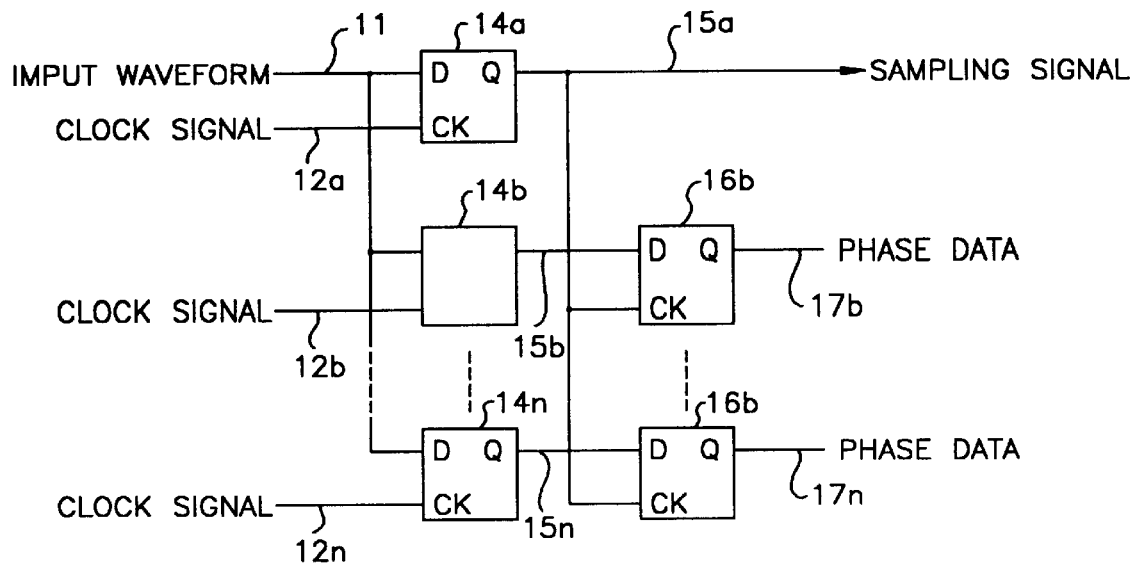
FIG. 1 is a block diagram showing the arrangement of a first embodiment of a sampling circuit system according to the invention.
Figure 2:
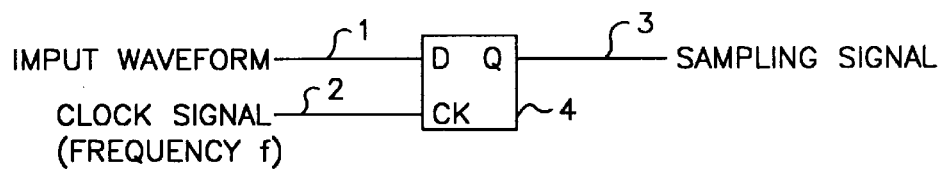
FIG. 2 is a block diagram showing the arrangement of a conventional sampling circuit.

Referring now to the accompanying drawings, a preferred embodiment of a sampling circuit system according to the invention is described hereinafter. FIG. 1 is a block diagram showing the arrangement of the preferred embodiment of the invention. In FIG. 1, an example wherein DFFs are used as sampling circuits is shown. The sampling circuit system according to the preferred embodiment comprises a first group consisting of a plurality (n) of sampling circuits 14a~14n, using the DFFs in FIG. 1, and a second group consisting of sampling circuits 16b~16n, using a number (n−1) of the DFFs, less than the number of the sampling circuits 14a~14b in the first group by one.

A predetermined sampling circuit among the sampling circuits 14a~14b in the first group, for example, the sampling circuit 14a is designated as a standard sampling circuit. An input waveform 11, a signal to be sampled, is inputted to respective input terminals D of the sampling circuits 14a~14n in the first group while clock signals 12a~12n are inputted, respectively, to respective clock input terminals CK of the sampling circuits 14a~14n in the first group.

In this embodiment, the clock signals 12b~12n inputted to the respective clock input terminals CK of the sampling circuits 14b~14n in the first group other than the standard sampling circuit 14a are out of phase from each other by 2 π/n (n=an integer not less than 3) radian, respectively, on the basis of the clock signal 12a inputted to the standard sampling circuit 14a. Sampling of the input waveform 11 is performed through the respective sampling circuits 14a~14n in the first group with the clock signals 12a~12n.

Sampling signals 15a~15n are outputted, respectively, from respective output terminals Q of the sampling circuits 14a~14n in the first group, wherein sampling has been performed. The sampling signal 15a outputted from the standard sampling circuit 14a among the sampling circuits 14a~14n in the first group is inputted as a clock signal 15a to respective clock input terminals CK of the sampling circuits 16b~16n in the second group.

In consequence of the sampling circuit 14a being used as the standard sampling circuit, the number of the sampling circuits 16b~16n in the second group is less than that of the sampling circuits 14a~14n in the first group by one as described in the foregoing. That is, the number is reduced to (n−1). The sampling signals 15b~15n outputted from the sampling circuits 14b~14n in the first group, respectively, are inputted to respective input terminals D of the sampling circuits 16b~16n in the second group, and sampled again with the clock signal 15a, thereby outputting phase data 17b~17n, respectively.

Now, operation of the sampling circuit system is described with reference to FIG. 1.

The input waveform 11 is inputted simultaneously to the respective input terminals D of the sampling circuits 14a~14n in the first group. At the same time, the clock signal 12a is inputted to the clock input terminal CK of the standard sampling circuit 14a among the sampling circuits 14a~14n in the first group, and the clock signals 12b~12n, out of phase from the clock signal 12a, and from each other, by 2 π/n (n=an integer not less than 3) radian, respectively, are inputted to the respective clock input terminals CK of the sampling circuits 14b~14n in the first group.

After sampling the input waveform 11 in the sampling circuits 14a~14n in the first group with the clock signals 12a~12n, the sampling signals 15a~15n, out of phase from each other by 2 π/n radian, respectively, are outputted from the respective output terminals Q of the sampling circuits 14a~14n in the first group.

The sampling signal 15a outputted from the standard sampling circuit 14a among the sampling circuits 14a~14n (n in total number) in total number) in the first group is inputted as a common clock signal 15a to the respective clock input terminals CK of the sampling circuits 16b~16n {(n−1) in total number} in the second group.

Other sampling signals 15b~15n outputted from the respective output terminals Q of the sampling circuits 14b~14n in the first group are inputted as signals to be sampled to the respective input terminals D of the sampling circuits 16b~16n {(n−1) in total number} in the second group. As a result, the sampling signals 15b~15n outputted from the respective output terminals Q of the sampling circuits 14b~14n of the first group are again sampled in the sampling circuits 16b~16n {(n−1) in total number} of the second group with the clock signal 15a, and outputted from the respective output terminals Q of the sampling circuits 16b~16n of the second group as the phase data 17b~17n.

The phases of the phase data 17b~17n can be detected, respectively, by a resolution of 2 π/n radian depending on how many of the phase data 17b~17n are at "H" level. Hence, information equivalent to that obtained when sampling is performed with a frequency multiplied by n is obtained. That is, without increasing frequencies of the clock signals 12a~12n for sampling, a sampling resolution equivalent to 1/n of respective periods of the clock signals for the sampling circuits 14a~14n in the first group can be obtained.

A second embodiment of the invention is now described hereinafter wherein the clock signals 12a~12n are out of phase from each other by 2 π/n radian, respectively, when n=4. In the case where n=4, a phase is advanced by π/2 radian on the basis of a phase wherein all the phase data 17b~17n outputted from the respective output terminals Q of the sampling circuits 16b~16n of the second group in FIG. 1 are at "L" level if one of the phase data 17b~17n is at "H" level.

Further, if two of the phase data 17b~17n are at "H" level, it can be detected that a phase is advanced by π radian, and if three of the phase data 17b~17n are at "H" level, it can be detected that a phase is advanced by 3 π/2 radian.

Thus, it is possible to detect four phases, that is, phases advanced by 0 radian, π/2 radian, π radian, and 3 π/2 radian, respectively, depending on the number of the phase data at "H" level among the phase data 17b~17n. Consequently, a sampling resolution equivalent to that obtained when the input waveform 11 is sampled with clock signals for sampling at a frequency increased by four times can be obtained by use of the phase data 17b~17n.

In the second embodiment of the invention, a case wherein n=4 is described. In short, it is possible to find out how many times the input wareform 11 is sampled in the sampling circuits 14a~14n wherein sampling is performed with the clock signals 12a~12n, out of phase from each other by 2 π/n radian, respectively, at a point in time when the input waveform 11 is sampled in a sampling circuit serving as the standard sampling circuit among the sampling circuits 14a~14n in the first group, for example, the sampling circuits 14a as in the case of the first embodiment, by checking the phase data outputted from the sampling circuits 16b~16n in the second group. Hence, if an input waveform is sampled m times in the sampling circuits of the first group, it can be detected that a phase is advanced by 2 πm /n radian {0≦m≦(n−1)}.

With the sampling circuit system according to the invention, an input waveform is sampled in the plurality of the sampling circuits in the first group with the clock signals, out of phase from each other by 2 π/n radian, respectively, and sampling signals outputted from the sampling circuits in the first group, excluding a sampling circuit serving as the standard sampling circuit among the sampling circuits in the first group, are inputted to the sampling circuits in the second group, less in number by one than the number of the sampling circuits in the first group while the sampling signals outputted from the sampling circuits in the first group are again sampled with a sampling signal from the standard sampling circuit as a common clock signal for the sampling circuits in the second group so that a sampling resolution can be enhanced without increasing the frequencies of the clock signals for sampling.

What is claimed is:

1. A sampling circuit system comprising a first group consisting of any number (n) of sampling circuits wherein sampling of an input waveform is performed with clock signals, out of phase by 2 π/n radian (n=an integer not less than 3) from each other, respectively, designating a predetermined one of the sampling circuits, as a standard sampling circuit, and a second group consisting of sampling circuits, equivalent in number to the sampling circuits of the first group excluding the standard sampling circuit, wherein sampling signals output from the sampling circuits of the first group excluding the standard sampling circuit as respective input waveforms are sampled with a sampling signal output from the standard sampling circuit as a clock signal.

* * * * *